US009185806B2

(12) United States Patent
Takagi et al.

(10) Patent No.: US 9,185,806 B2
(45) Date of Patent: Nov. 10, 2015

(54) METHOD FOR MANUFACTURING PRINTED WIRING BOARD AND PRINTED WIRING BOARD

(71) Applicant: IBIDEN CO., LTD., Ogaki-shi (JP)

(72) Inventors: Fumitaka Takagi, Ogaki (JP); Nobuhisa Kuroda, Ogaki (JP); Mariko Kimura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 73 days.

(21) Appl. No.: 14/041,743

(22) Filed: Sep. 30, 2013

(65) Prior Publication Data

US 2014/0090877 A1 Apr. 3, 2014

(30) Foreign Application Priority Data

Sep. 28, 2012 (JP) ................................. 2012-217283

(51) Int. Cl.
*H05K 1/18* (2006.01)
*H05K 1/11* (2006.01)
(Continued)

(52) U.S. Cl.
CPC .......... *H05K 1/183* (2013.01); *H01L 23/49827* (2013.01); *H05K 1/181* (2013.01); *H05K 3/02* (2013.01); *H05K 3/3452* (2013.01); *H01L 24/16* (2013.01); *H01L 24/32* (2013.01); *H01L 24/73* (2013.01); *H01L 24/83* (2013.01); *H01L 24/92* (2013.01); *H01L 2224/16225* (2013.01); *H01L 2224/32225* (2013.01); *H01L 2224/73204* (2013.01); *H01L 2224/83385* (2013.01); *H01L 2224/83411* (2013.01); *H01L 2224/83444* (2013.01); *H01L 2224/83455* (2013.01); *H01L 2224/83464* (2013.01); *H01L 2224/92125* (2013.01); *H01L 2924/14* (2013.01); *H01L 2924/15192* (2013.01);
(Continued)

(58) Field of Classification Search
CPC ......... H05K 1/181; H05K 3/02; H05K 1/183; H05K 3/3452; H05K 3/3436; H05K 2201/09845; H05K 2201/10515; H05K 2201/10674; H01L 23/49827; H01L 2924/15311; H01L 2224/83411; H01L 24/73; H01L 2224/16225; H01L 24/32; H01L 2224/83444; H01L 2224/32225; H01L 2224/73204; H01L 2224/92; H01L 2924/15331; H01L 2924/14; H01L 2224/83455; H01L 24/16; H01L 24/92; H01L 2224/83385; H01L 2924/15192; H01L 2224/83464
USPC .......... 174/260; 361/760, 761, 762, 764, 767, 361/768, 783
See application file for complete search history.

(56) References Cited

U.S. PATENT DOCUMENTS 8,410,374 B2    4/2013 Furuta et al.
2006/0103030 A1*  5/2006 Aoki et al. ..................... 257/778
(Continued)

FOREIGN PATENT DOCUMENTS

JP    2012-009586    1/2012

*Primary Examiner* — Hoa C Nguyen
(74) *Attorney, Agent, or Firm* — Oblon, McClelland, Maier & Neustadt, L.L.P.

(57) ABSTRACT

A printed wiring board includes an interlayer resin insulation layer, a pad structure formed on the interlayer resin insulation layer and positioned to mount a semiconductor device, and a solder-resist layer formed on the interlayer resin insulation layer and having an opening portion exposing a portion of the pad structure from the solder-resist layer. The opening portion of the solder-resist layer has a bottom surface such that the bottom surface of the opening portion is exposing an upper surface and a portion of a side surface of the pad structure.

20 Claims, 12 Drawing Sheets

(51) Int. Cl.
*H05K 3/02* (2006.01)
*H01L 23/498* (2006.01)
*H05K 3/34* (2006.01)
*H01L 23/00* (2006.01)

(52) U.S. Cl.
CPC ............... *H01L 2924/15311* (2013.01); *H01L 2924/15331* (2013.01); *H05K 3/3436* (2013.01); *H05K 2201/09845* (2013.01); *H05K 2201/10515* (2013.01); *H05K 2201/10674* (2013.01)

(56) References Cited

U.S. PATENT DOCUMENTS

| | | | | |
|---|---|---|---|---|
| 2009/0027864 | A1* | 1/2009 | Cho et al. | 361/767 |
| 2009/0246911 | A1* | 10/2009 | Watanabe | 438/108 |
| 2010/0139962 | A1* | 6/2010 | Kaneko | 174/260 |
| 2010/0147560 | A1* | 6/2010 | Kaneko | 174/250 |
| 2010/0147573 | A1* | 6/2010 | Fukuda | 174/260 |
| 2010/0252304 | A1* | 10/2010 | Muramatsu et al. | 174/251 |
| 2013/0192877 | A1 | 8/2013 | Furuta et al. | |

\* cited by examiner (A)

(B)

(C)

(D)

(A)

(B)

METHOD FOR MANUFACTURING PRINTED WIRING BOARD AND PRINTED WIRING BOARD

CROSS-REFERENCE TO RELATED APPLICATIONS

The present application is based upon and claims the benefit of priority to Japanese Patent Application No. 2012-217283, filed Sep. 28, 2012, the entire contents of which are incorporated herein by reference.

BACKGROUND OF THE INVENTION

1. Field of the Invention

The present invention relates to a printed wiring board where a semiconductor element is mounted on its upper surface while another printed wiring board is mounted thereon.

2. Description of Background Art

In Japanese Laid-Open Patent Publication No. 2012-9586, a solder-resist layer is filled between pads for peripheral mounting, and solder is used as a spacer to maintain clearance between an IC chip and a printed wiring board. Also, in Japanese Laid-Open Patent Publication No. 2012-9586, the thickness of a solder-resist layer is reduced by using a sandblasting method. The entire contents of this publication are incorporated herein by reference.

SUMMARY OF THE INVENTION

According to one aspect of the present invention, a printed wiring board includes an interlayer resin insulation layer, a pad structure formed on the interlayer resin insulation layer and positioned to mount a semiconductor device, and a solder-resist layer formed on the interlayer resin insulation layer and having an opening portion exposing a portion of the pad structure from the solder-resist layer. The opening portion of the solder-resist layer has a bottom surface such that the bottom surface of the opening portion is exposing an upper surface and a portion of a side surface of the pad structure.

According to one aspect of the present invention, a method for manufacturing a printed wiring board includes forming a pad structure on an interlayer resin insulation layer such that the pad structure is positioned to mount a semiconductor element, forming a solder-resist layer on the interlayer resin insulation layer and the pad structure, and forming an opening portion in the solder-resist layer such that the opening portion of the solder-resist layer exposes a portion of the pad structure from the solder-resist layer. The opening portion of the solder-resist layer is formed such that the opening portion of the solder-resist layer has a bottom surface exposing an upper surface and a portion of a side surface of the pad structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
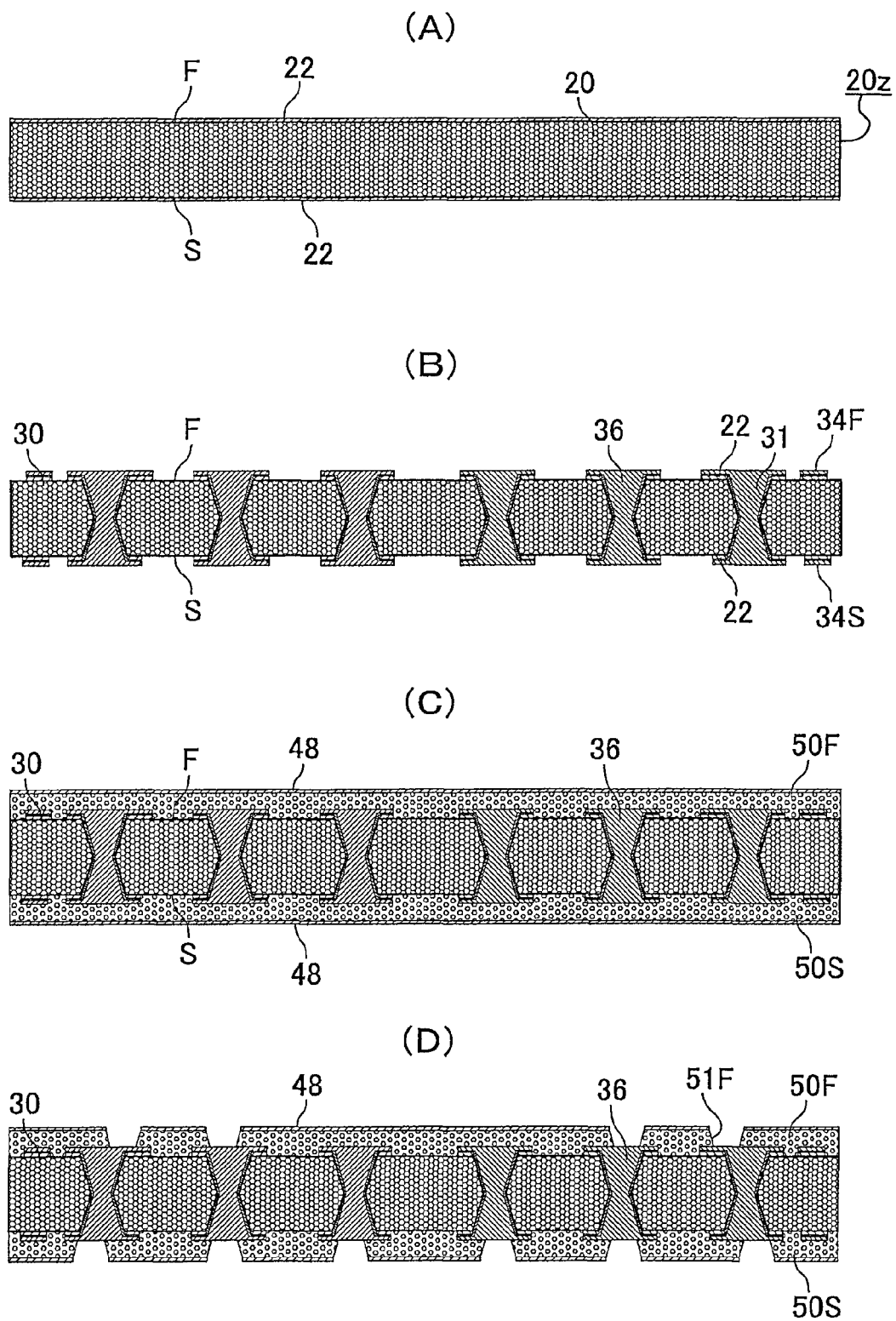
FIGS. 1(A)-1(D) are views of steps showing a method for manufacturing a printed wiring board according to a first embodiment of the present invention.
Figure 2:
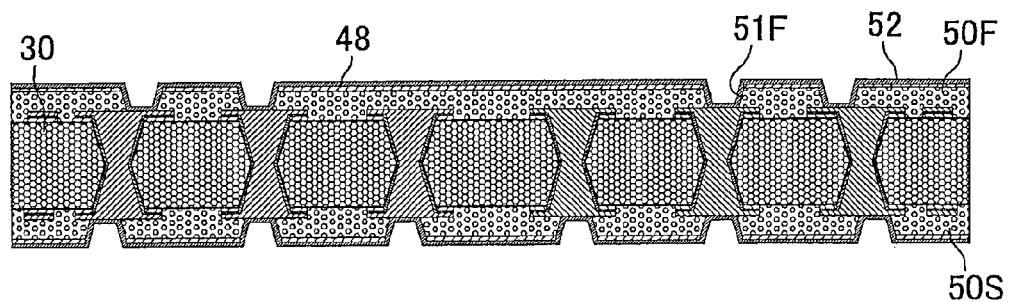
FIGS. 2(A)-2(D) are views of steps showing the method for manufacturing a printed wiring board according to the first embodiment.
Figure 2:
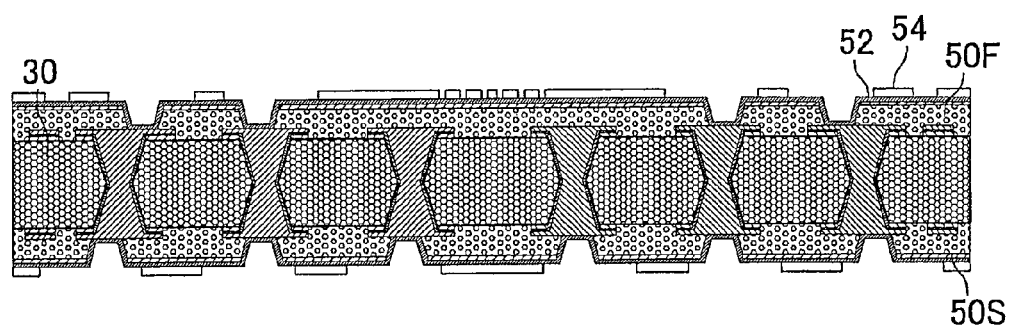
Figure 2:
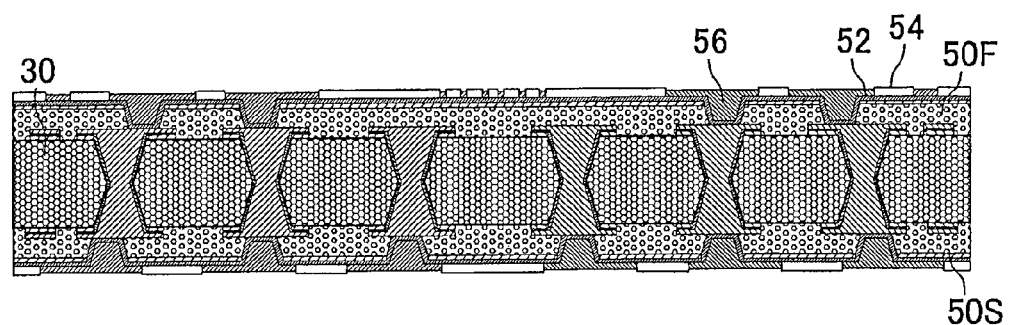
Figure 2:
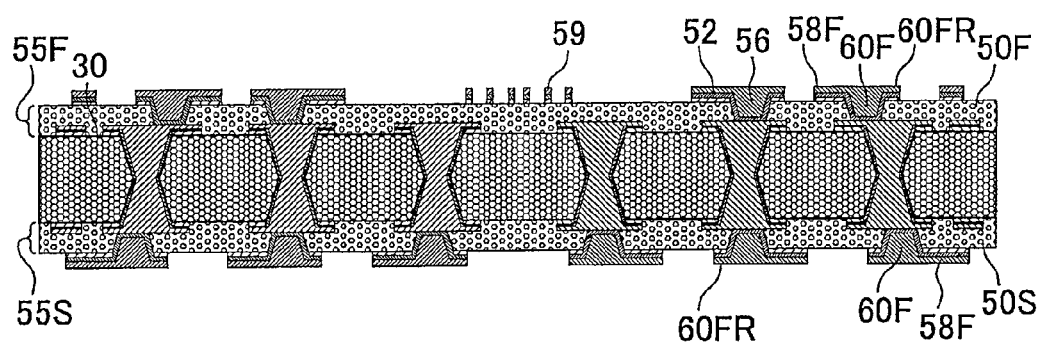
Figure 3:
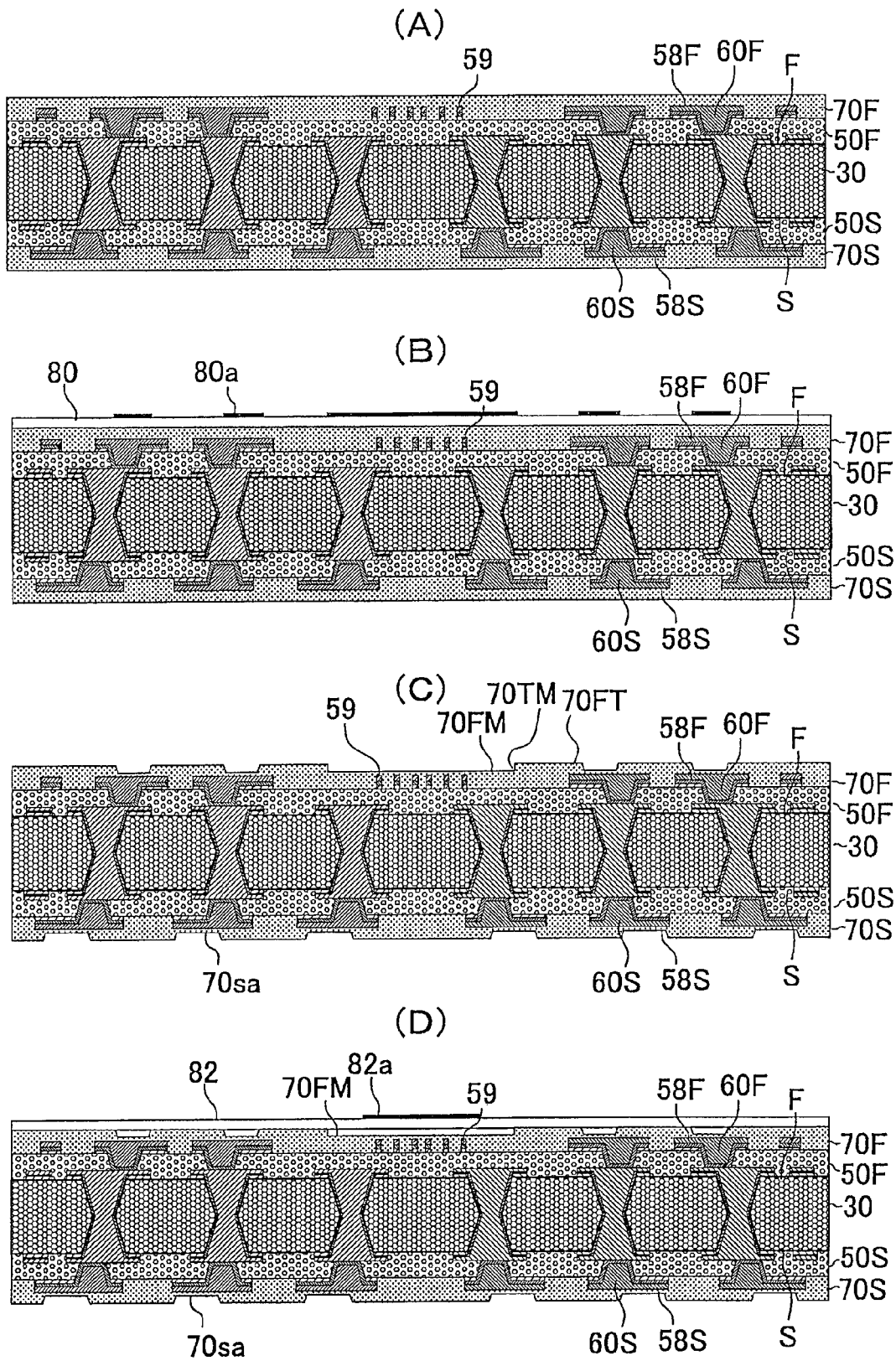
FIGS. 3(A)-3(D) are views of steps showing the method for manufacturing a printed wiring board according to the first embodiment.

The embodiments will now be described with reference to the accompanying drawings, wherein like reference numerals designate corresponding or identical elements throughout the various drawings.

First Embodiment

Figure 4:
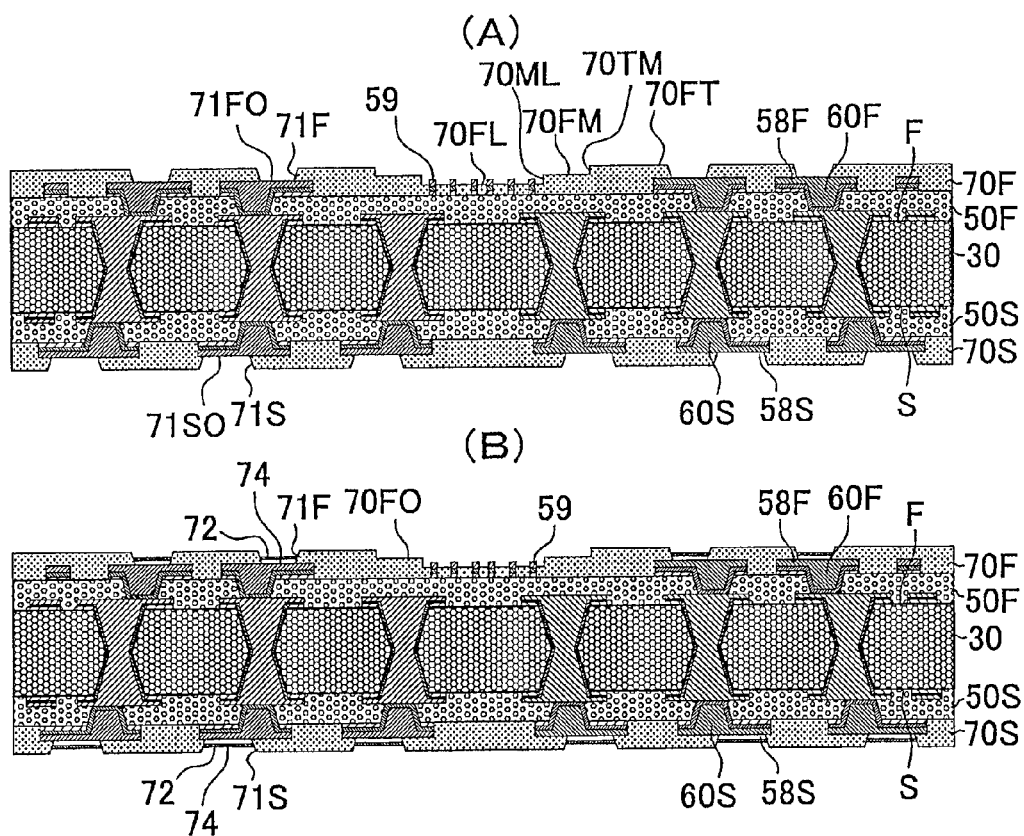
FIGS. 4(A)-4(B) are views of steps showing the method for manufacturing a printed wiring board according to the first embodiment.
Figure 5:
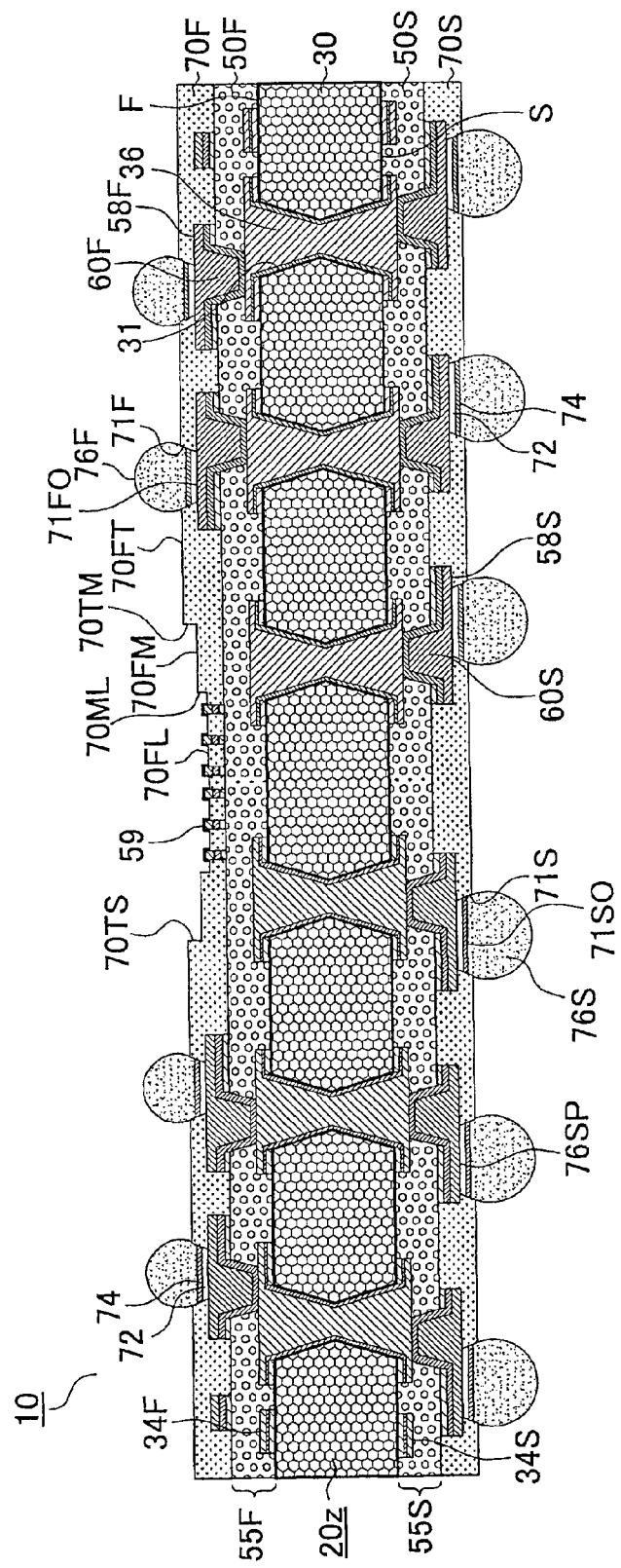
FIG. 5 is a cross-sectional view of a printed wiring board according to the first embodiment.

As shown in FIG. 5, printed wiring board 10 of a first embodiment has core substrate 30. The core substrate has insulative substrate (20z) having first surface (F) and second surface (S) opposite the first surface, first conductive layer (34F) formed on first surface (F) of the insulative substrate and second conductive layer (34S) formed on the second surface of the insulative substrate. The core substrate further includes through-hole conductors 36 connecting first conductive layer (34F) and second conductive layer (34S). Through-hole conductor 36 is formed in penetrating hole 31 which penetrates through the insulative substrate. Penetrating hole 31 and through-hole conductor 36 are each shaped like an hourglass in that their opening portions, each having an opening on first surface (F) and second surface (S) of the core substrate, taper toward their respective centers and are joined at the centers. The core substrate shown in FIG. 4 may be manufactured by the method described in U.S. Pat. No. 7,786,390, for example. A conductive layer of the core substrate includes multiple conductive circuits and through-hole lands formed around through-hole conductors 36. First surfaces of the printed wiring board and the core substrate correspond to the first surface of the insulative substrate, and second surfaces of the printed wiring board and the core substrate correspond to the second surface of the insulative substrate.

Interlayer resin insulation layer (50F) is formed on first surface (F) of core substrate 30 and on first conductive layer (34F). Conductive patterns (58F) and pads 59 are formed on interlayer resin insulation layer (50F). Conductive patterns (58F) and pads 59 are connected to first conductive layer (34F) and through-hole conductors 36 by via conductors (60F) which penetrate through interlayer resin insulation layer (50F). The first-surface side buildup layer (55F) is formed with interlayer resin insulation layer (50F), conductive patterns (58F), pads 59 and via conductors (60F).

Interlayer resin insulation layer (50S) is formed on second surface (S) of core substrate 30 and on second conductive layer (34S). Conductive patterns (58S) are formed on interlayer resin insulation layer (50S). Conductive patterns (58S) are connected to second conductive layer (34S) and through-hole conductors 36 by via conductors (60S) which penetrate through interlayer resin insulation layer (50S). Second-surface side buildup layer (55S) is formed with interlayer resin insulation layer (50S), conductive patterns (58S) and via conductors (60S).

Solder-resist layer (70F) is formed on the first-surface side buildup layer, and solder-resist layer (70S) is formed on the second-surface side buildup layer. First-surface side solder-resist layer (70F) has solder-bump openings (71F) to expose upper surfaces of conductive patterns (58F) and via conductors (via lands) (60F), along with opening (70ML) and opening (70TM), which expose upper surfaces of pads 59 and are for mounting semiconductor element 90. Second-surface side solder-resist layer (70S) has openings (71S) to expose upper surfaces of conductive patterns (58S) and via conductors (via lands) (60S).

Figure 8:
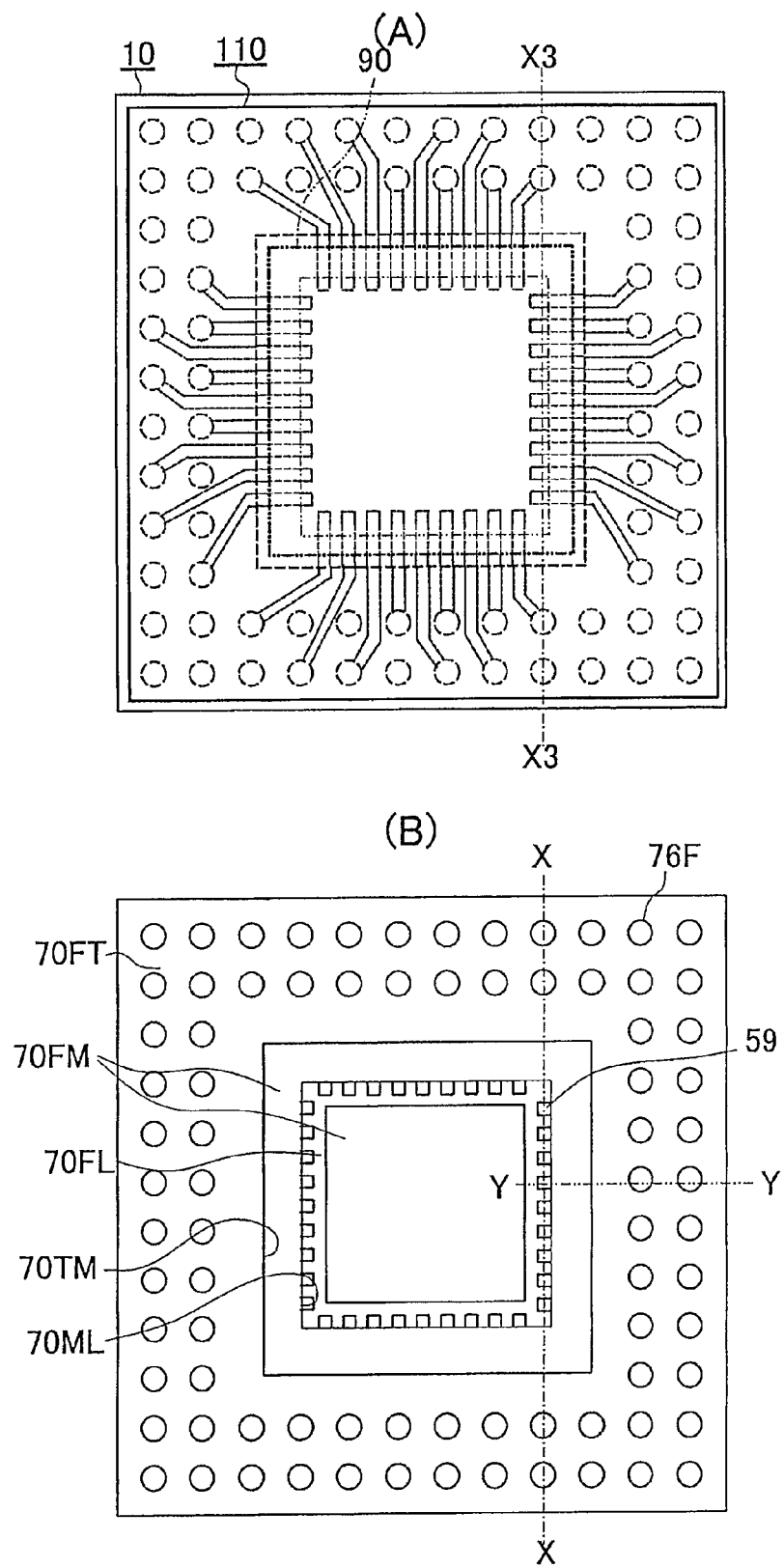
FIGS. 8(A)-8(B) are plan views of a printed wiring board during manufacturing steps according to the first embodiment.

FIG. 5 shows a cross-sectional view of a printed wiring board according to the first embodiment of the present invention, and FIG. 8(B) shows a plan view. The cross section at (X-X) in FIG. 8(B) corresponds to FIG. 5.

Printed wiring board 10 has pad 59 which is formed on first-surface side interlayer resin insulation layer (50F) and is for mounting semiconductor element 90, and solder-resist layer (70F) having second opening section (70ML) which is formed on interlayer resin insulation layer (50F) and exposes the upper surface and part of the side surface of pad 59, and having first opening section (70TM) in which semiconductor element 90 is to be accommodated. The upper surface of pad 59 protrudes from bottom surface (70FL) of the second opening section, which forms the bottom of second opening section (70ML). Since second opening section (70ML) is the opening to expose pad 59 for connection with pad 92 of semiconductor element 90, it is located inside first opening section (70TM) for accommodating semiconductor element 90. The opening area of second opening section (70ML) is set smaller than the opening area of first opening section (70TM). Since semiconductor element 90 is accommodated inside first opening section (70TM), underfill material 96 for securing semiconductor element 90 does not flow out from a surface of printed wiring board 10. Only the upper surface and part of the side surface of pad 59 are exposed, and solder-resist layer (70F) is filled among multiple pads 59. Even if intervals of multiple pads 59 are narrow, since such intervals are filled with solder-resist layer (70F), voids are less likely to remain among multiple pads 59 when underfill material 96 is flowed between semiconductor element 90 and second opening section (70ML). Thus, it is thought that migration caused by voids is suppressed.

The upper surface and part of the side surface of pad 59 are exposed from bottom surface (70FL) of the second opening section. Solder-plating layer 77 for connection with pad 92 of semiconductor element 90 is formed on the exposed upper and side surfaces of pad 59 (FIG. 9(B)). For solder-plating 77, it is preferred to use at least one type selected from a group of Sn plating, Ni/Au plating and Ni/Pd/Au plating.

The exposed thickness of pad 59 from the upper surface of the pad is preferred to be 3~8 μm. If the exposed thickness of a pad is less than 3 μm, the distance is short between semiconductor element 90 and bottom surface (70FL) of the second opening section in solder-resist layer (70F), and underfill material 96 is thought to be hard to flow. Furthermore, the exposed area of pad 59 decreases, and the amount of solder plating 77 formed on its upper surface is reduced. Thus, the connection reliability with pad 92 of semiconductor element 90 is thought to be lowered. If the exposed thickness of pad 59 exceeds 8 μm, it is thought that defects may occur, such as voids remaining among multiple pads 59. In addition, since the exposed area of pad 59 increases, the amount of solder plating 77 formed on its upper surface increases, and solder bridges may occur.

The exposed thickness of a pad from its upper surface is preferred to be 20~50% of the pad thickness. If the exposed thickness of a pad is less than 20%, the distance is short between semiconductor element 90 and bottom surface (70FL) of the second opening section in solder-resist layer (70F), and underfill material 96 is thought to be hard to flow. Furthermore, the exposed area of pad 59 decreases, and the amount of solder plating 77 formed on its upper surface is reduced. Thus, the connection reliability with pad 92 of semiconductor element 90 is thought to be lowered. If the exposed thickness of pad 59 exceeds 50%, it is thought that defects may occur, such as voids remaining among multiple pads 59. In addition, since the exposed area of pad 59 increases, the amount of solder plating 77 formed on its upper surface increases, and solder bridges may occur.

In a printed wiring board of the first embodiment, only the upper surface and part of the side surface of pad 59 are exposed, and solder-resist layer (70F) is filled among multiple pads 59. Thus, even if intervals of multiple pads 59 are narrow, since such intervals are filled with solder-resist layer (70F), voids are less likely to remain among multiple pads 59 when underfill material 96 is flowed between semiconductor element 90 and second opening section (70ML). Thus, it is thought that migration caused by voids is suppressed.

Method for Manufacturing Printed Wiring Board of the First Embodiment

FIGS. 1~4 show a method for manufacturing printed wiring board 10 of the first embodiment.

(1) Double-sided copper-clad laminate 20 is prepared with insulative substrate (20z) having first surface (F) and second surface (S) opposite the first surface along with metal foils (22, 22) laminated on both of its surfaces (FIG. 1(A)). As for the double-sided copper-clad laminate, ELC4785TH-G made by Sumitomo Bakelite Co., Ltd. may be used. Copper foils (22, 22) are laminated respectively on first surface (F) and second surface (S) of the insulative substrate.

The insulative substrate is made of resin and reinforcing material. As for reinforcing material, glass cloth, aramid fiber, glass fiber and the like are listed, for example. As for resin, epoxy resin, BT (bismaleimide triazine) resin and the like are listed.

(2) The double-sided copper-clad laminate is processed, and core substrate 30 having through-hole conductors 36, first conductive layer (34F) and second conductive layer (34S) is complete (FIG. 1(B)). The first surface of the core substrate corresponds to the first surface of the insulative substrate, and the second surface of the core substrate corresponds to the second surface of the insulative substrate. Core substrate 30 may be manufactured by the method described in U.S. Pat. No. 7,786,390, for example.

(3) Prepreg, which contains inorganic fiber, inorganic particles such as silica and thermosetting resin such as epoxy, and copper foil 48 are laminated in that order on first surface (F) and second surface (S) of core substrate 30. Then, thermal pressing is conducted so that interlayer resin insulation layer (50F) and interlayer resin insulation layer (50S) are formed from the prepreg, and copper foils 48 are adhered to the interlayer resin insulation layers (FIG. 1(C)). Here, interlayer resin insulation layers containing inorganic fiber are laminated; however, it is also an option to use interlayer resin insulation layers that do not contain core material.

(4) Next, using a CO2 gas laser, via-conductor openings (51F, 51S) are formed in interlayer resin insulation layers (50F, 50S) respectively (FIG. 1(D)).

(5) Electroless copper-plated layers (52, 52) are formed on copper foils 48 and on the inner walls of openings (51F, 51S) (FIG. 2(A)).

(6) Plating resists 54 are formed on electroless copper-plated layers 52 (FIG. 2(B)).

(7) Electrolytic copper-plated layers 56 are formed on electroless copper-plated layers 52 exposed from plating resists 54 (FIG. 2(C)).

Figure 7:
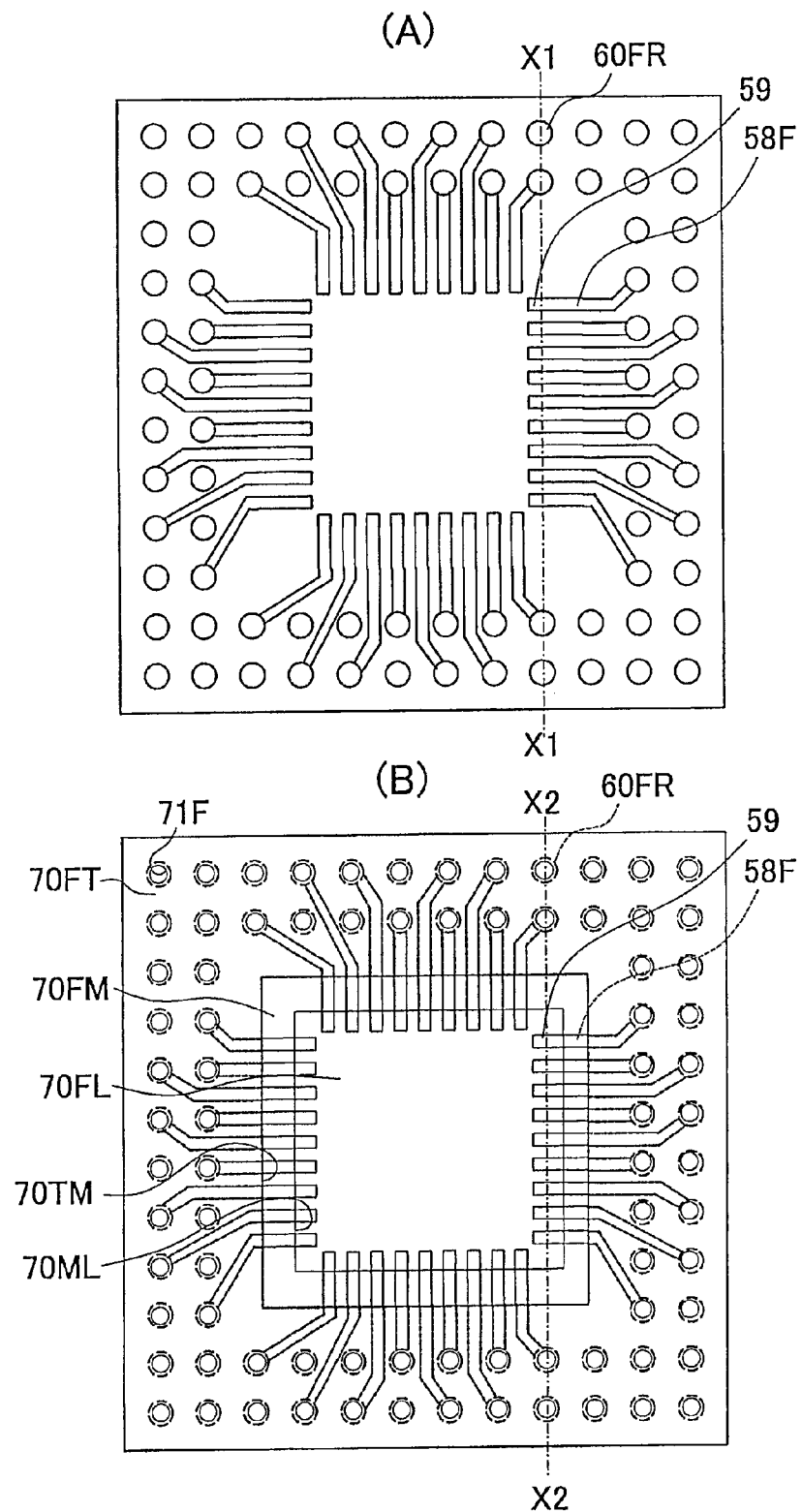
FIGS. 7(A)-7(B) are plan views of a printed wiring board during manufacturing steps according to the first embodiment.

(8) Plating resists 54 are removed. Electroless copper-plated layers 56 and copper foils 48 among portions of electrolytic copper-plated layers 52 are etched away to form pads 59, conductive patterns (58F, 58S) and via conductors (60F, 60S) to have a layer thickness of 18 μm (FIG. 2(D)). Via conductors (60F, 60S) have via lands (60FR, 60SR). On the first-surface side and the second-surface side, buildup layers (55F, 55S) are formed. FIG. 7(A) is a plan view of the printed wiring board shown in FIG. 2(D). FIG. 2(D) corresponds to the cross section at (X1-X1) in FIG. 7(A). End portions 59 of conductive patterns (58F) will be exposed from solder-resist layer (70F) which is to be formed in a later step. The exposed portions of conductive patterns (58F) form pads 59.

(9) The first-surface side buildup layer is covered by first-surface side solder-resist composition (70F), and the second-surface side buildup layer is covered by second-surface side solder-resist composition (70S) (FIG. 3(A)). The solder-resist composition may be made of resin that can be multilayered such as the one described in Japanese Laid-Open Patent Publication 2011-71406, for example.

(10) Mask 80 for first exposure is placed on solder-resist composition (70F), which is then exposed to light (FIG. 3(B)). Black spots (81a) are formed on the first-exposure mask to correspond to portions that do not require curing (FIG. 3(B)). When exposed to light using the first-exposure mask, solder-resist layer (70F) covering via conductors (60F) and via lands (60FR) on the periphery of printed wiring board 10 is cured in a frame shape, while upper portions of pads for connection with a memory-mounting substrate are not exposed to light and remain uncured (FIG. 3(B)). Although not shown in the drawing, second-surface side solder-resist composition (70S) is also cured. Here, exposure to light may be conducted without exposure masking, but by scanning a light source to irradiate the uncured solder-resist composition.

(11) A first opening step is conducted so that uncured solder-resist compositions (70F, 70S), which were not cured by exposure to light in the previous step, are etched away using an etching solution. During that time, first opening section (70TM), bottom surface (70FM) of the first opening section, connection-pad openings (71F), and uppermost surface (70FT) of the portion cured by exposure to light are formed on the first-surface side (FIG. 3(C)). Opening depths of first opening section (70TM) and connection-pad openings (71F) are adjusted by etching duration. As for an etching solution, one such as that described in Japanese Laid-Open Patent Publication 2011-71406 may be used, for example.

(12) Mask 82 for second exposure is placed on solder-resist composition (70S), which is then exposed to light. Black spots (82a) are formed on the second exposure mask to correspond to portions that do not require curing (FIG. 3(D)). When exposed to light using the second exposure mask, solder-resist layer (70F), positioned on the bottom surface (70FM) of the first opening section except for the portion to form the second opening section, is cured. Namely, solder-resist layer (70F), positioned on the upper portions of conductive patterns 58 connected to pads 59, is cured.

(13) A second opening step is conducted so that uncured solder-resist composition (70F), which was not cured by exposure to light in the previous step, is etched away using an etching solution. During that time, bottom surface (70FM) of the first opening section, second opening section (70ML) and bottom surface (70FL) of the second opening section, which are cured by exposure to light, are formed on the first-surface side. The upper surface and part of the side surface of pad 59 are exposed. Pad 59 protrudes 5 μm from the upper surface of the pad to bottom surface (70FL) of the second opening section. In the present embodiment, since the layer thickness of pad 59 is set at 18 μm, 25.3% of the layer thickness is set to protrude. At the same time, solder-bump openings (71F) are formed on the uppermost surface (70FT), exposing pads (71FO), while openings (71S) are formed in second-surface side solder-resist layer (70S), exposing pads (71SO) (FIG. 4(A)). Then, the solder-resist composition is thermally cured to form solder-resist layers (70F, 70S). FIG. 7(B) shows a plan view of the printed wiring board in FIG. 4(A). FIG. 4(A) corresponds to the cross section at (X2-X2) in FIG. 7(B). Accordingly, solder-resist layer (70F) is complete, having first opening section (70TM), second opening section (70ML), uppermost surface (70FT), bottom surface (70FM) of the first opening section, and bottom surface (70FL) of the second opening section.

Here, by adjusting etching duration, roughness may be modified on uppermost surface (70FT), bottom surface (70FM) of the first opening section and bottom surface (70FL) of the second opening section.

(14) Nickel-plated layer 72 is formed on pads (71FO, 71SO), and gold-plated layer 74 is further formed on nickel-plated layer 72 (FIG. 4(B)). Nickel-palladium-gold layers may be formed instead of nickel-gold layers.

Figure 10:
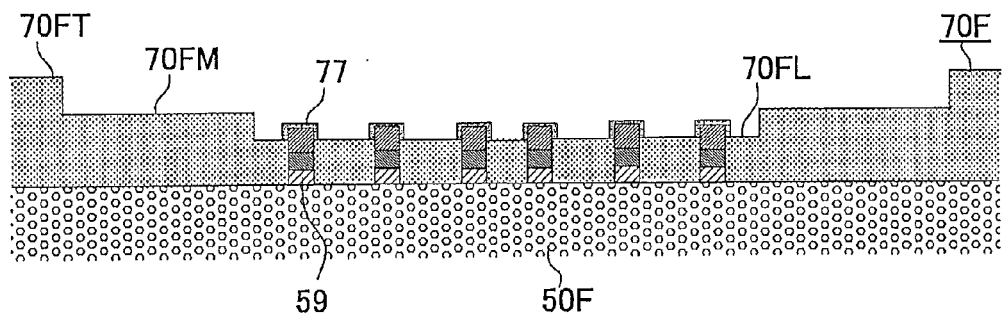
FIGS. 10(A)-10(C) are partially enlarged cross-sectional views of a printed wiring board according to the first embodiment.
Figure 10:
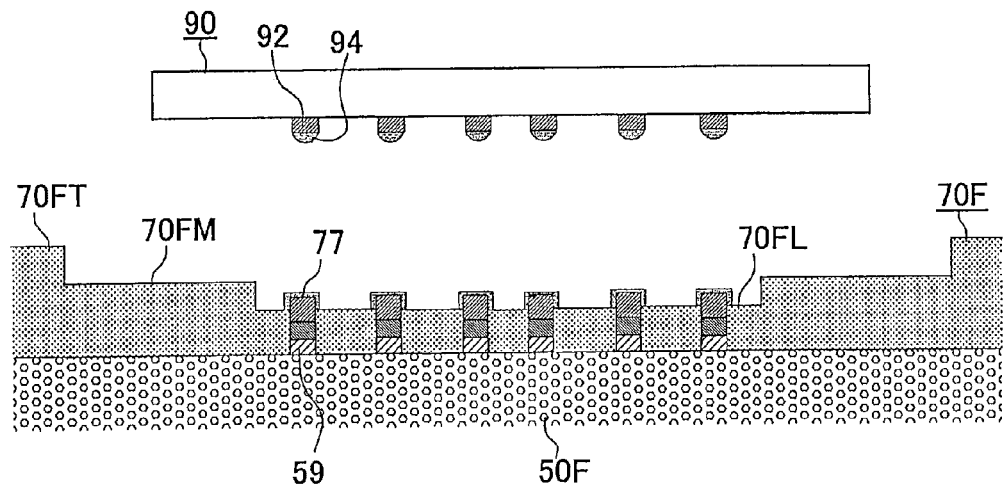
Figure 10:
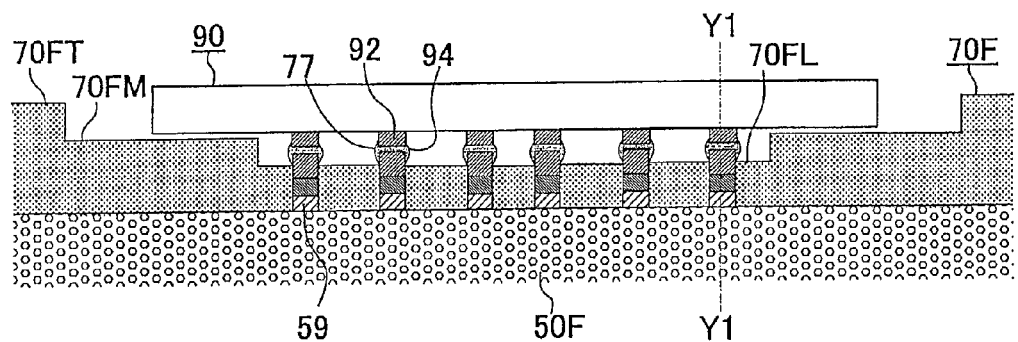

(15) FIG. 10 shows enlarged views of bottom surface (70FL) of the second opening section where pads 59 are formed. Solder plating 77 covers upper surfaces of pads 59 (FIG. 10(A)). Solder plating 77 is formed using at least one type selected from a group of Sn plating, Ni/Au plating and Ni/Pd/Au plating.

(16) Solder balls are loaded on pads (71FO) of solder-resist layer (70F) and on pads (71SO) of solder-resist layer (70S), and a reflow is conducted to form solder bumps (76F, 76S). Accordingly, a printed wiring board is complete (FIG. 5).

Semiconductor element 90 is mounted through pads 59. Conductive posts 92 are formed on the lower surface of semiconductor element 90 as shown in FIG. 10(B), and solder 94 is provided on tips of conductive posts 92.

Figure 9:
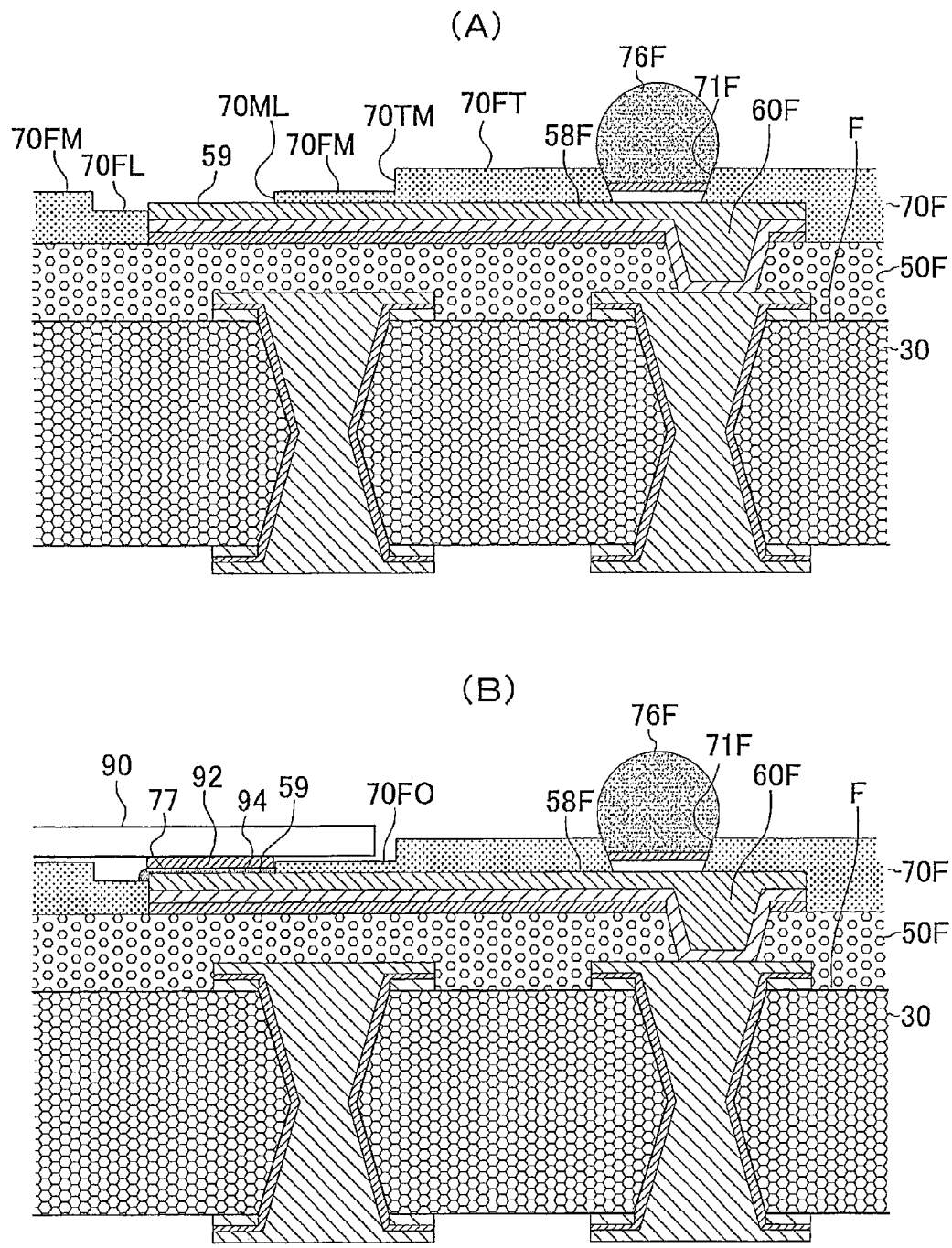
FIGS. 9(A)-9(B) are partially enlarged cross-sectional views of a printed wiring board according to the first embodiment.

As shown in FIG. 10(C) and FIG. 9(B), which is an enlarged view of the cross section at (Y1-Y1) in FIG. 10(C), conductive posts 92 and pads 59 are connected through solder plating 77 and solder 94 so that semiconductor element 90 is mounted. In the first embodiment, the upper surface and part of the side surface of pad 59 are slightly exposed from bottom surface (70FL) of the second opening section in solder-resist layer (70F). Thus, it is easier to control the amount of solder plating 77 formed on the exposed portion of pad 59, and solder bridges caused by excess solder plating 77 are suppressed from occurring. Since solder plating 77 is also formed on the exposed side surface of pad 59, connection reliability is high.

Figure 11:
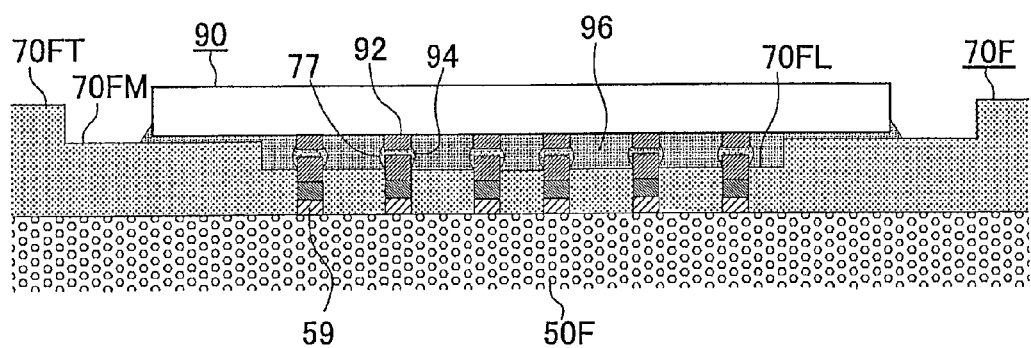
FIG. 11 is a partially enlarged cross-sectional view of a printed wiring board according to the first embodiment.

As shown in FIG. 11, underfill material 96 is filled between semiconductor element 90 and solder-resist layer (70F). In the first embodiment, the upper surface and part of the side surface of pad 59 are exposed from bottom surface (70FL) of the second opening section in solder-resist layer (70F), making the height difference smaller between pad 59 and solder-resist layer (70F). Thus, it is easy to fill underfill material 96, and voids are thought to be less likely to occur, thereby suppressing migration.

Figure 6:
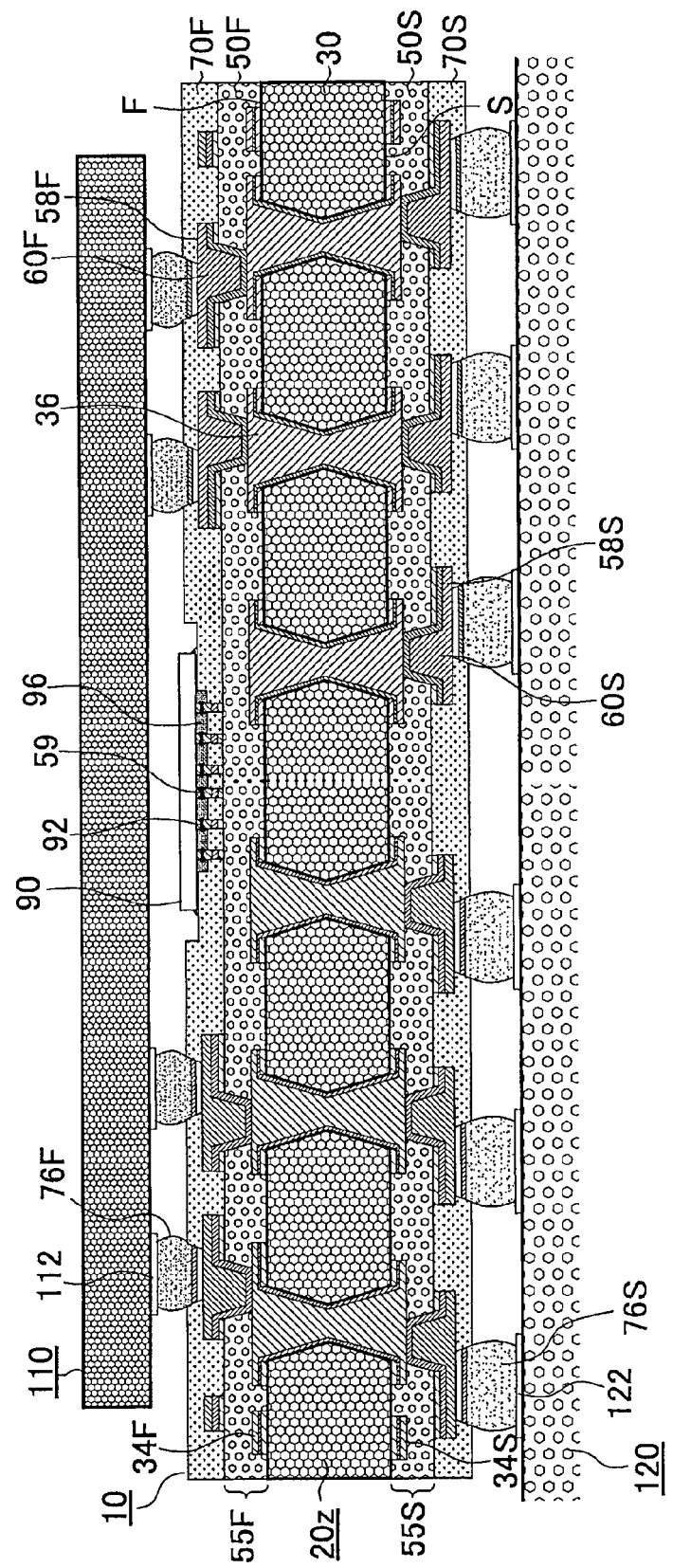
FIG. 6 is a cross-sectional view of a printed wiring board according to the first embodiment.

Printed wiring board 110 is mounted through solder bumps (76F). Then, printed wiring board 10 is mounted on motherboard 120 through solder bumps (76S) (FIG. 6). FIG. 8(A) is a plan view of FIG. 6. FIG. 6 corresponds to the cross section at (X3-X3) of FIG. 8(A).

First Modified Example of the First Embodiment

Figure 12:
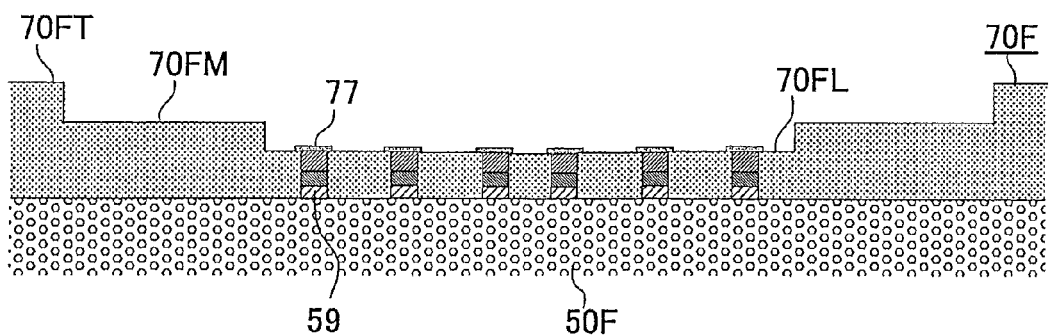
FIGS. 12(A)-12(B) are enlarged cross-sectional views of pads of a printed wiring board according to modified examples of the first embodiment.
Figure 12:
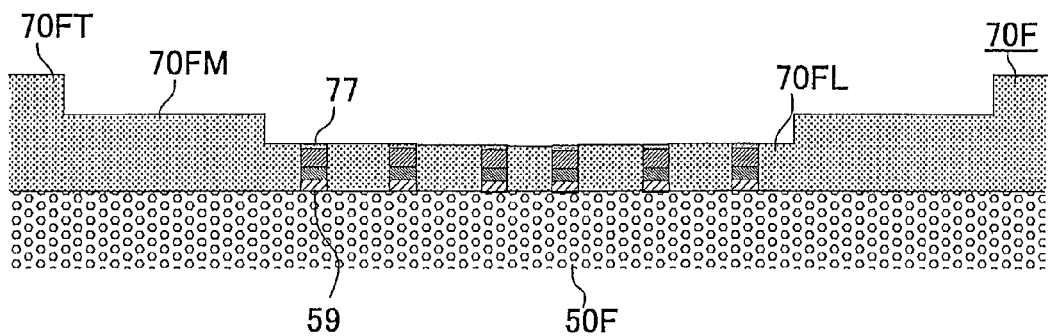

FIG. 12(A) shows pad 59 of a printed wiring board according to a first modified example of the first embodiment. The upper surface of pad 59 is set at the same height as bottom surface (70FL) of the second opening section of solder-resist layer (70F) in the first modified example of the first embodiment. Since pad 39 does not interfere with underfill material 96 in the first modified example of the first embodiment, the reliability of underfill material 96 is further enhanced.

Second Modified Example of the First Embodiment

FIG. 12(B) shows pad 59 of a printed wiring board according to a second modified example of the first embodiment. The upper surface of pad 59 is set lower than bottom surface (70FL) of the second opening section of solder-resist layer (F) in the second modified example of the first embodiment. Since pad 59 does not interfere with underfill material 96 in the second modified example of the first embodiment, the reliability of underfill material 96 is further enhanced.

The above-described embodiment shows an example where a structure according to an embodiment of the present invention is applied to a buildup multilayer board. However, a structure according to an embodiment of the present invention may also be applied to various printed wiring boards.

When solder is used as a spacer to maintain clearance between an IC chip and a printed wiring board, it is thought that the height of the solder may vary, and underfill material may not be filled well. Also, the wiring distance between the IC chip and the printed wiring board increases by the height of the solder. Moreover, when the thickness of a solder-resist layer is reduced by using a sandblasting method, the manufacturing process is thought to become complex and may result in higher cost.

A printed wiring board according to an embodiment of the present invention has high connection reliability with an IC chip, and an embodiment of the present invention includes a method for manufacturing such a printed wiring board.

As semiconductors are becoming highly integrated, the pitch of pads for peripheral mounting is decreasing. When the pitch of pads for peripheral mounting is narrow, underfill material is hard to fill well, resulting in voids, migration caused by voids, and lowered reliability. In addition, if the pitch is narrow, solder plating on a pad surface may touch its adjacent pad, thereby producing solder bridges.

A printed wiring board according to an embodiment of the present invention has the following: an interlayer resin insulation layer, a pad which is formed on the interlayer resin insulation layer and is for mounting a semiconductor element, and a solder-resist layer which is formed on the interlayer resin insulation layer and has an opening to expose the upper surface and part of a side surface of the pad. As a technological feature of such a printed wiring board, the upper surface of the pad is set to protrude from the upper surface of the solder-resist layer, which forms the bottom of the opening.

A method for manufacturing a printed wiring board according to another embodiment of the present invention includes the following: forming an interlayer resin insulation layer; on the interlayer resin insulation layer, forming a pad for mounting a semiconductor element; and on the interlayer resin insulation layer, forming a solder-resist layer having an opening while exposing the upper surface and part of a side surface of the pad. As a technological feature of such a method, the upper surface of the pad is set to protrude from the upper surface of the solder-resist layer, which forms the bottom of the opening.

In a printed wiring board according to an embodiment of the present invention, a solder-resist layer is filled among multiple pads, and the upper surface and part of the side surface of a pad is exposed. Accordingly, since the height difference is small between the upper surface of a pad and the upper surface of the solder-resist layer among multiple pads, it is easy to fill underfill material and voids are less likely to occur. Since voids are suppressed from occurring, migration caused by voids is suppressed. In addition, a pad is set in such a way that its upper surface and part of the side surface protrude slightly from the upper surface of the solder-resist layer among multiple pads. Therefore, it is easier to control the amount of solder plating to be formed on the upper and side surfaces of the pad, and solder bridges caused by excess solder plating are prevented. An opening section of a solder-resist layer is formed by a method in which an uncured solder-resist composition is gradually removed from the surface using an etching solution after exposure to light. Therefore, the thickness of the solder-resist layer at the opening section is controlled.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an interlayer resin insulation layer;
   a pad structure formed on the interlayer resin insulation layer and positioned to mount a semiconductor device; and
   a solder-resist layer formed on the interlayer resin insulation layer and having an opening portion exposing a portion of the pad structure from the solder-resist layer, wherein the opening portion of the solder-resist layer has a bottom surface such that the bottom surface of the opening portion is exposing an upper surface and a portion of a side surface of the pad structure, and the opening portion of the solder-resist layer has a first opening section and a second opening section formed inside the first opening section.

2. The printed wiring board according to claim 1, wherein the second opening section of the opening portion has an opening area which is set smaller than an opening area of the first opening section of the opening portion.

3. The printed wiring board according to claim 1, wherein the opening portion of the solder-resist layer is formed such that the semiconductor device is accommodated in the opening portion of the solder-resist layer.

4. The printed wiring board according to claim 3, wherein the pad structure has an exposed thickness which is set in a range of 3~8 μm from the upper surface of the pad structure.

5. The printed wiring board according to claim 3, wherein the pad structure has an exposed thickness which is set in a range of 20~50% of a thickness of the pad structure from the upper surface of the pad structure.

6. The printed wiring board according to claim 1, wherein the first opening section of the opening portion is formed such that the semiconductor device is accommodated in the first opening section of the opening portion.

7. The printed wiring board according to claim 1, wherein the pad structure has an exposed thickness which is set in a range of 3~8 μm from the upper surface of the pad structure.

8. The printed wiring board according to claim 1, wherein the pad structure has an exposed thickness which is set in a range of 20~50% of a thickness of the pad structure from the upper surface of the pad structure.

9. The printed wiring board according to claim 1, wherein the portion of the pad structure exposed by the opening portion comprises at least one film selected from the group consisting of Sn plating, Ni/Au plating and Ni/Pd/Au plating.

10. The printed wiring board according to claim 1, wherein the opening portion of the solder-resist layer has the first opening section formed on a surface of the solder-resist layer such that the first opening section does not expose the upper surface of the pad structure and the second opening section formed inside the first opening section such that the second opening section is exposing the upper surface and the portion of the side surface of the pad structure.

11. The printed wiring board according to claim 10, wherein the second opening section of the opening portion has an opening area which is set smaller than an opening area of the first opening section of the opening portion.

12. The printed wiring board according to claim 10, wherein the opening portion of the solder-resist layer is formed such that the semiconductor device is accommodated in the opening portion of the solder-resist layer.

13. The printed wiring board according to claim 10, wherein the first opening section of the opening portion is formed such that the semiconductor device is accommodated in the first opening section of the opening portion.

14. The printed wiring board according to claim 10, wherein the pad structure has an exposed thickness which is set in a range of 3~8 μm from the upper surface of the pad structure.

15. The printed wiring board according to claim 10, wherein the pad structure has an exposed thickness which is set in a range of 20~50% of a thickness of the pad structure from the upper surface of the pad structure.

16. The printed wiring board according to claim 10, wherein the portion of the pad structure exposed by the opening portion comprises at least one film selected from the group consisting of Sn plating, Ni/Au plating and Ni/Pd/Au plating.

17. A method for manufacturing a printed wiring board, comprising:
    forming a pad structure on an interlayer resin insulation layer such that the pad structure is positioned to mount a semiconductor device;
    forming a solder-resist layer on the interlayer resin insulation layer and the pad structure; and
    forming an opening portion in the solder-resist layer such that the opening portion of the solder-resist layer exposes a portion of the pad structure from the solder-resist layer,
    wherein the opening portion of the solder-resist layer is formed such that the opening portion of the solder-resist layer has a bottom surface exposing an upper surface and a portion of a side surface of the pad structure, and the forming of the opening portion comprises forming a first opening section on a surface of the solder-resist layer such that the first opening section does not expose the upper surface of the pad structure and forming a second opening section inside the first opening section such that the second opening section exposes the upper surface and the portion of the side surface of the pad structure.

18. The method for manufacturing a printed wiring board according to claim 17, wherein the second opening section of the opening portion is formed such that the pad structure has an exposed thickness which is set in a range of 3~8 μm from the upper surface of the pad structure.

19. The method for manufacturing a printed wiring board according to claim 17, wherein the second opening section of the opening portion is formed such that the pad structure has an exposed thickness which is set in a range of 20~50% of a thickness of the pad structure from the upper surface of the pad structure.

20. The method for manufacturing a printed wiring board according to claim 17, wherein the forming of the pad structure comprising forming the portion of the pad structure to be exposed by the opening portion such that the portion of the pad structure comprises at least one film selected from the group consisting of Sn plating, Ni/Au plating and Ni/Pd/Au plating.

* * * * *